United States Patent
Beaufils et al.

(10) Patent No.: US 10,866,567 B2
(45) Date of Patent: Dec. 15, 2020

(54) DEVICE FOR THE TRANSFER OF WATCH COMPONENTS

(71) Applicant: ROLEX SA, Geneva (CH)

(72) Inventors: Yann Beaufils, Gaillard (FR); Adrien Noel, Bonne (FR)

(73) Assignee: ROLEX SA, Genève (CH)

( * ) Notice: Subject to any disclaimer, the term of this patent is extended or adjusted under 35 U.S.C. 154(b) by 0 days.

(21) Appl. No.: 16/549,049

(22) Filed: Aug. 23, 2019

(65) Prior Publication Data
US 2020/0073332 A1 Mar. 5, 2020

(30) Foreign Application Priority Data

Sep. 3, 2018 (EP) .................................. 18192184

(51) Int. Cl.
*G04D 3/00* (2006.01)
*G04D 1/06* (2006.01)
(Continued)

(52) U.S. Cl.
CPC .......... *G04D 3/0069* (2013.01); *B65G 11/023* (2013.01); *B65G 47/06* (2013.01); *B65G 47/24* (2013.01); *G04D 1/06* (2013.01)

(58) Field of Classification Search
CPC ..... B65G 11/103; B65G 11/00; B65G 11/023; B65G 11/063; B65G 11/203; B65G 47/06; B65G 47/08; B65G 47/145; B65G 47/24; H05K 13/021; H05K 13/022; H05K 13/0452; B81C 3/002; B81C 3/004; B81C 3/007; B81C 99/002; G04C 3/0069; G04C 1/06
(Continued)

(56) References Cited

U.S. PATENT DOCUMENTS 3,411,266 A * 11/1968 Dix ........................... H01J 9/46
53/142
3,426,883 A 2/1969 Aronstein et al.
(Continued)

FOREIGN PATENT DOCUMENTS

DE     893 744 C     10/1953
GB     2 258 861 A    2/1993
(Continued)

OTHER PUBLICATIONS

European Search Report and Written Opinion dated Feb. 6, 2019 issued in counterpart application No. EP18192184; w/ English machine translation (20 pages).

*Primary Examiner* — James R Bidwell
(74) *Attorney, Agent, or Firm* — Westerman, Hattori, Daniels & Adrian, LLP (57) ABSTRACT

A device (30, 40) for the transfer of a plurality of watch components (2) arranged on a first support (10) to their arrangement on a second support (20), wherein it comprises an inlet surface (31, 41) comprising inlet orifices (33, 43) so arranged as to correspond to a first arrangement of the watch components (2) on a first support (10), an outlet surface (32, 42) comprising outlet orifices (34, 44) so arranged as to correspond to a second arrangement of the watch components (2) on a second support (20), and guide elements (35, 45) adapted to guide the watch components (2) automatically from the inlet orifices (33, 43) to the outlet orifices (34, 44).

25 Claims, 5 Drawing Sheets

(51) Int. Cl.
*B65G 47/06* (2006.01)
*B65G 11/02* (2006.01)
*B65G 47/24* (2006.01)

(58) Field of Classification Search
USPC .............................................. 193/25 FT, 14
See application file for complete search history.

(56) References Cited

U.S. PATENT DOCUMENTS

| | | | |
|---|---|---|---|
| 3,490,134 A | | 1/1970 | Debisschop |
| 3,661,298 A | | 5/1972 | Ioffe et al. |
| 3,956,812 A | * | 5/1976 | Kawakami ............. A44B 19/62 |
| | | | 29/768 |
| 5,337,465 A | * | 8/1994 | Tamaki ................ H05K 13/022 |
| | | | 29/740 |
| 2008/0023435 A1 | | 1/2008 | Wu et al. |
| 2015/0259143 A1 | | 9/2015 | Tse et al. |

FOREIGN PATENT DOCUMENTS

| | | | | |
|---|---|---|---|---|
| JP | 51-23958 A | | 2/1976 | |
| WO | 83/03559 | * | 10/1983 | ............. B65G 47/24 |

\* cited by examiner

DEVICE FOR THE TRANSFER OF WATCH COMPONENTS

This application claims priority of European patent application No. EP18192184.2 filed Sep. 3, 2018, the content of which is hereby incorporated by reference herein in its entirety.

TECHNICAL FIELD OF THE INVENTION

The present invention relates to a device for the transfer of watch components from a first conditioning or support to a second conditioning or support, the transfer device being utilized as part of a method of manufacturing in watchmaking. The invention similarly relates to an assembly of transfer devices mounted in series. The invention similarly relates to a method of manufacturing a suchlike device for the transfer of watch components, as well as to a method of handling watch components.

BACKGROUND ART

In the field of watchmaking, it is known to position watch components such as bracelet links or blanks, for example, in conditionings or on supports in order to proceed to stages of manufacturing such as stages of machining, polishing, galvanic deposition, cleaning, for example, and/or in order to transfer the watch components between the different stations for the implementation of a method of manufacturing. Depending on the stages, the conditionings or the supports possess the shapes and the arrangements of different watch components in order to adapt to the corresponding preparation station, for example in order to adapt to the type of manipulation or to the type of machine tool utilized by the manufacturing process. The different machine tools have specific constraints necessitating a particular positioning of the watch components, or perhaps a particular orientation of the latter. These watch components may be positioned in conditionings or on supports that are adapted specifically to a given machine tool. It is not possible as a general rule to retain the same conditioning for the different machine tools that are utilized within a method of manufacturing, and it is often necessary to recondition the watch components in order for the conditioning to be adapted to the specific constraints of a given machine tool.

The watch components are transferred manually, as a general rule, from one conditioning to the other in order to preserve the integrity of their surfaces, especially the functional surfaces or the decorations of the watch components. Manual transfer requires stages of gripping, manipulating and positioning of each of the watch components. The watch components must be manipulated with particular care during the manufacturing operations. In actual fact, on the one hand the watch components are fragile and their appearance must be exempt from any imperfection such as an impact, a scratch or soiling. On the other hand, the watch components are small, which makes their manipulation particularly delicate: the watch components are thus able to escape easily from the hands of an operator and/or are difficult to manipulate. Furthermore, the watch components must be positioned at the different work stations with sufficient accuracy in order for the manufacturing operations to be correctly executed.

The manual transfer of the watch components is accordingly a slow and not very ergonomic method. The care that is necessary in order to position the watch components with precision and without causing damage to them is generally contradictory with the speed of execution of this positioning.

OBJECT OF THE INVENTION

The aim of the invention is to make available a transfer device and a method of handling watch components which address the disadvantages outlined above and improve the methods of handling watch components that are familiar from the prior art.

A first object of the invention is to supply a device permitting said watch components to be transferred effectively from a first conditioning or support to a second conditioning or support, all the while ensuring the protection of the watch components during the transfer.

The invention relates to a device for the transfer of a plurality of watch components arranged on a first support to their arrangement on a second support, the transfer device comprising an inlet surface comprising inlet orifices so arranged as to correspond to a first arrangement of the watch components on a first support, an outlet surface comprising outlet orifices so arranged as to correspond to a second arrangement of the watch components on a second support, and guide elements adapted to guide the watch components automatically from the inlet orifices to the outlet orifices.

The plurality of watch components are transferred advantageously substantially simultaneously.

The guide elements may be in the form of channels, each respectively connecting an inlet orifice positioned on the inlet surface to an outlet orifice positioned on the outlet surface, at least one guide element causing the sliding of a watch component on a wall of said at least one guide element from an inlet orifice to an outlet orifice.

At least one guide element may comprise all or some of the following characterizing features:
  a curved guide surface; and/or
  a guide surface comprising at least one chicane; and/or
  a guide surface adapted to cause the displacement of a watch component according to a translatory movement and/or according to a rotational movement; and/or
  a guide surface adapted to cause or not to cause a modification to the orientation of a watch component; and/or
  a guide surface adapted to cause a modification to the orientation of a watch component in such a way that its contact surface with the first support is different from its contact surface with the second support.

The device for the transfer of watch components may be made of polymer or coated at least partially with a surface made of polymer, or ceramic, or metal, especially an alloy of metals, in order to avoid clattering the watch components.

The device for the transfer of watch components may comprise a removable grating comprising grating orifices arranged in a manner that is identical or compatible with the inlet orifices of the inlet surface in order to be capable of being overlaid on these inlet orifices of the inlet surface and to permit the passage of watch components successively through the grating orifices and the inlet orifices.

The grating and the inlet surface may comprise a means of indexation for the correct positioning of the grille relative to the inlet surface.

The device for the transfer of watch components may comprise a plate arranged in a removable manner between the inlet surface of the first transfer device and the grating in order to permit the temporary retention of watch components on the inlet surface before their transfer through the inlet orifices after retraction or displacement of the plate.

The plate may comprise openings according to an arrangement that is identical to or compatible with the inlet orifices of the inlet surface, and the plate may be mobile relative to the inlet surface, in such a way as to be able to occupy two positions, a first position in which its openings are not totally overlapped by the inlet orifices of the inlet surface in such a way that watch components are still retained above the inlet surface, and a second position in which its openings are overlapped by inlet orifices of the inlet surface in such a way that watch components are allowed to be transferred through the openings in the plate and the inlet orifices of the inlet surface.

The device for the transfer of watch components may be adapted for the transfer of movement-blanks such as plates or bridges, wheels of the watch movement such as escape wheels, or even watch-making components such as bracelet links or dial plates or dial indices.

The device for the transfer of watch components may be adapted to be mounted in series with at least one second transfer device, as defined previously. It may comprise means of indexation and/or retention of a second transfer device in the area of its inlet surface and/or in the area of an outlet surface.

The invention similarly relates to an assembly of at least two devices for the transfer of watch components, as defined previously, arranged in series, in such a way that the respective guide elements of the at least two transfer devices are connected in order to form continuous guide elements on the assembly of the at least two transfer devices.

The invention similarly relates to a method of manufacturing of a device for the transfer of watch components, as defined previously, the method of manufacturing comprising a manufacturing stage by the addition of material, especially according to one des technologies following:
  i. modeling by deposition of molten material; or
  ii. polymerization or reticulation by layer of a polymer, especially stereolithography; or
  iii. bonding of a film with an adhesive (LOM, for Laminated Object Manufacturing); or
  iv. agglomeration of a layer of powder by laser sintering SLS (selective laser sintering); or
  v. melting of a powder with the help of a laser (SLM, for selective laser melting).

The invention similarly relates to a system for handling watch components comprising a first support comprising firsts housings for the transport and/or the implementation of at least one first operation on the watch components, a second, distinct support comprising second housings for the transport and/or the implementation of at least one second operation on the same watch components, and a transfer device of the kind defined previously and/or an assembly of transfer devices of the kind defined previously in order to transfer the watch components from the first housings of the first support to the second housings of the second support. The first support may be a tray or a container and/or the second support may be a tray or a container or a vessel, in particular a vessel filled with liquid or with a medium.

The invention similarly relates to a method of handling watch components comprising a stage of transport and/or of performing at least one first operation on the watch components arranged on a first support, a stage for the automatic transfer of the watch components from the first support onto a second support by means of a device of the kind defined previously and/or by means of an assembly of transfer devices of the kind defined previously, and a stage of transport and/or of performing at least one second operation on the watch components arranged on the second support.

BRIEF DESCRIPTION OF THE DRAWINGS

These objects, characterizing features and advantages of the present invention are explained in detail in the following description of a particular embodiment provided for non-restrictive purposes in relation to the accompanying figures, in which.

DESCRIPTION OF AN EMBODIMENT

In the figures as a whole and in the description, it is considered that the device for the transfer of watch components is resting on a horizontal surface. The expressions "top" and "bottom" are defined in relation to a vertical axis.

Figure 1:
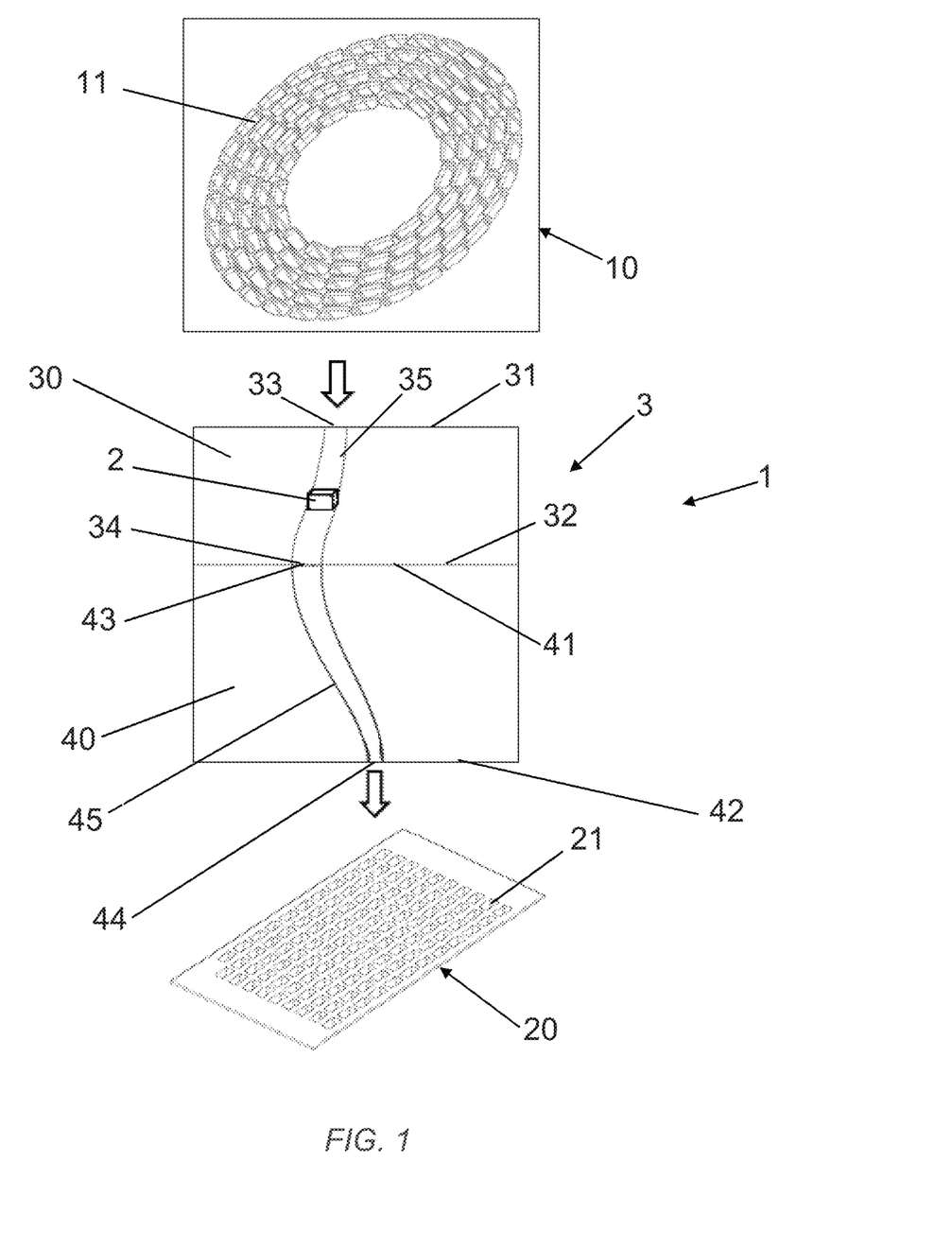
FIG. 1 is a schematic view of a system for handling watch components equipped with an assembly of two transfer devices according to one embodiment of the invention.

FIG. 1 depicts schematically a system 1 for handling watch components 2 according to one embodiment of the invention. The handling system 1 comprises a first support 10, comprising first housings, 11 and a second support 20 distinct from the first support 10, comprising second housings 21. The first housings 11 of the first support are arranged on the first support according to a first arrangement, and the second housings 21 of the second support are arranged on the second support according to a second arrangement, which is different from the first arrangement. The handling system 1 comprises an assembly 3 of two transfer devices 30, 40 to transfer watch components 2 from the first housings 11 of the first support 10 to the second housings 21 of the second support 20.

The watch components 2 may be component parts of a watch or a clock. The watch components may be blanks, especially blanks of the movement such as plates or bridges, wheels of the movement such as escapement wheels, or even watch-making components such as bracelet links or dial plates or dial indices or winding crowns, for example. According to the present embodiment, the watch components 2 are bracelet links of substantially parallelepipedal form. The bracelet links are mutually identical, although as a variant the transfer device could be utilized for conditioning different component parts and component parts of any shape.

Figure 2:
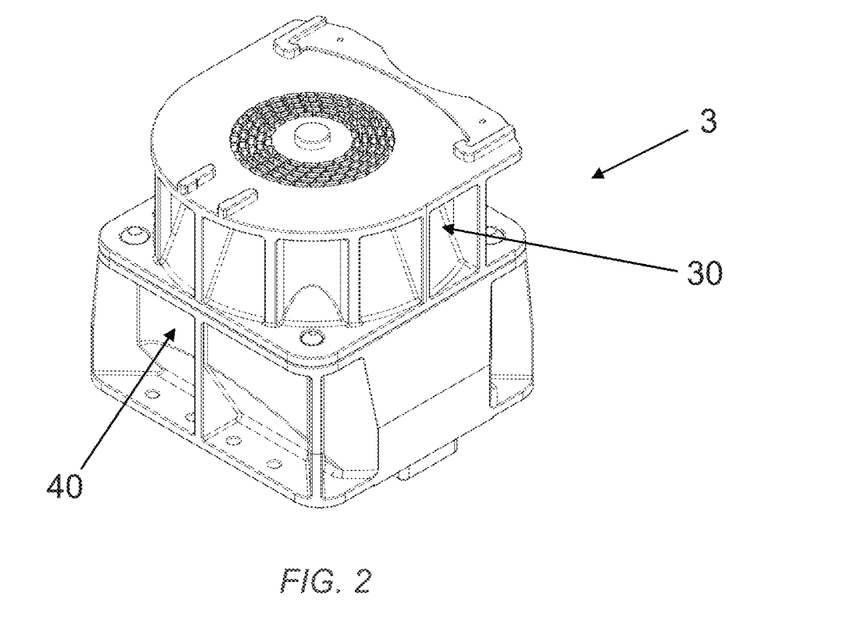
FIG. 2 is an isometric view of an assembly comprising two transfer devices according to one embodiment of the invention.

FIG. 2 depicts an embodiment according to the invention of the assembly 3 comprising two devices 30, 40 for the transfer of watch components 2. The two transfer devices 30, 40 are arranged in series, that is to say one above the other, in such a way as to be capable of cooperating. The invention similarly relates to a single transfer device utilized alone or also to an assembly 3 comprising any number of transfer devices arranged in series. As a variant, the two transfer devices 30, 40 that are now described could constitute one and the same piece.

Figure 3:
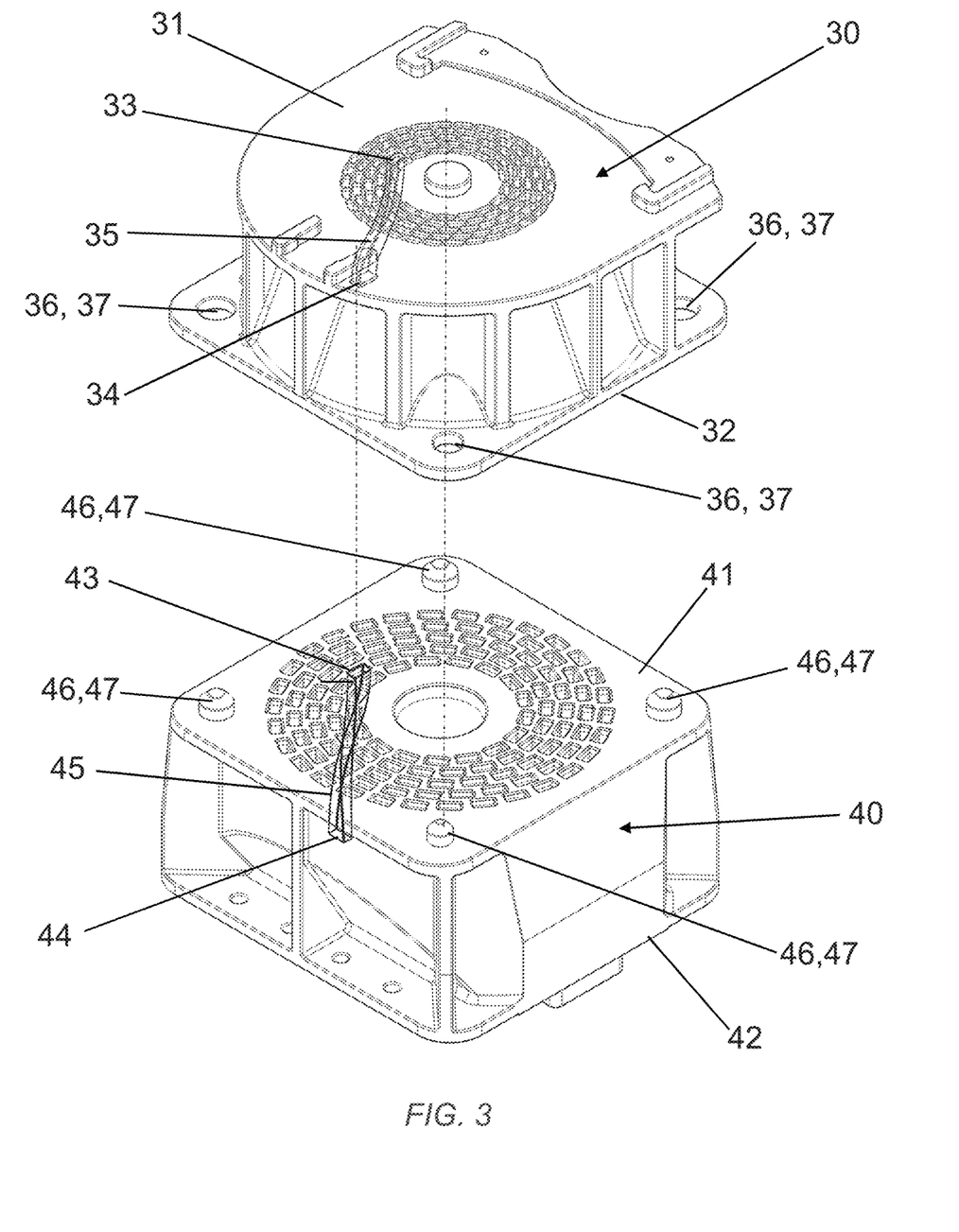
FIG. 3 is an exploded view of the assembly comprising the two transfer devices according to one embodiment of the invention.

FIG. 3 is an exploded view of the assembly 3, in which the first transfer device 30 (at the top) and the second transfer device 40 (at the bottom) can be identified more clearly. Each of the two transfer devices 30, 40 generally has the form of a box and comprises an inlet surface 31, 41, or upper surface, oriented towards the top, and an outlet surface 32, 42, or lower surface, oriented towards the bottom. When the first transfer device 30 is arranged in series with the second transfer device 40, the outlet surface 32 of the first transfer device 30 comes into contact with the inlet surface 41 or is at the very least situated facing the inlet surface 41 of the second transfer device 40.

Figure 4:
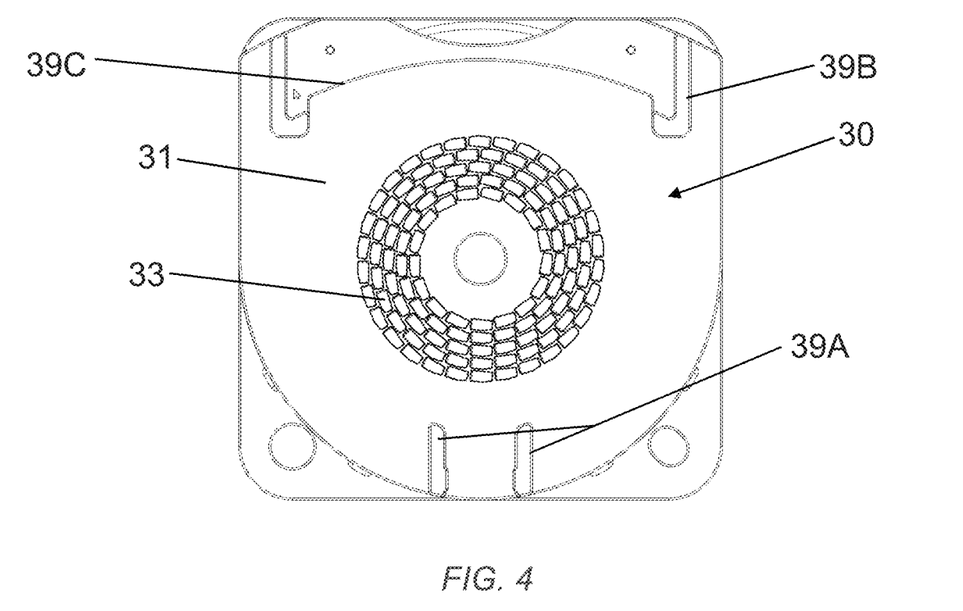
FIG. 4 is a view from above of a first transfer device according to one embodiment of the invention.

The inlet surface 31 of the first transfer device 30 is planar and has a generally circular shape. The outlet surface 32 is similarly planar and comprises a generally square shape. These surfaces 31, 32 could, of course, comprise a shape of any other geometry and could be curved or discontinuous, for example, and could optionally include means of indexation. The inlet surface 31 comprises inlet orifices 33 arranged in order to correspond to the first arrangement of the watch components 2 on the first support 10. More specifically, as is particularly apparent in FIG. 4, the first arrangement consists of an arrangement of the inlet orifices 33 according to five concentric circles. The outlet surface 32 comprises outlet orifices 34 ordered according to a third arrangement. Each inlet orifice 33 corresponds to a watch component 2 to be transferred. Each inlet orifice 33 could also correspond to one first housing 11 of the first support 10. Each first housing 11 of the first support 10 corresponds to one inlet orifice 33 of the inlet surface 31. Each first housing 11 of the first support 10 corresponds advantageously also to only one watch component 2 to be transferred. Similarly, each outlet orifice 34 could also correspond to one second housing 21 of the second support 20. Each second housing 21 of the second support 20 corresponds advantageously to one outlet orifice 34 of the outlet surface 32. Each second housing 21 of the second support 20 corresponds also to only one watch component 2 to be transferred. The inlet surface 31, 41 and the outlet surface 32, 42 of each transfer device may be parallel to each other. Each inlet orifice 33 of the inlet surface 31 is advantageously positioned facing one first housing 11 of the first support 10, for the transfer of one watch component 2. Similarly, each outlet orifice 34 of the outlet surface 32 is advantageously positioned facing one second housing 21 of the second support 20.

The inlet surface 41 of the second transfer device 40 is likewise planar and comprises a generally square shape, having the same dimensions as the outlet surface 32 of the first transfer device 30. The outlet surface 42 of the second transfer device 40 is similarly planar and comprises a generally square shape. The inlet surface 41 comprises inlet orifices 43 so arranged as to correspond to the third arrangement, that is to say to the arrangement of the outlet orifices 34 of the outlet surface 32 of the first transfer device 30. More specifically, the third arrangement consists of an arrangement of the inlet orifices 43 according to five concentric circles having a larger diameter than the five concentric circles defining the first arrangement. It will be noted that the inlet orifices 43 of second transfer device are more widely spaced than the inlet orifices 33 of the first transfer device. The outlet surface 42 comprises outlet orifices 44 so arranged as to correspond to the second arrangement of the watch components 2 on the second support.

Figure 5:
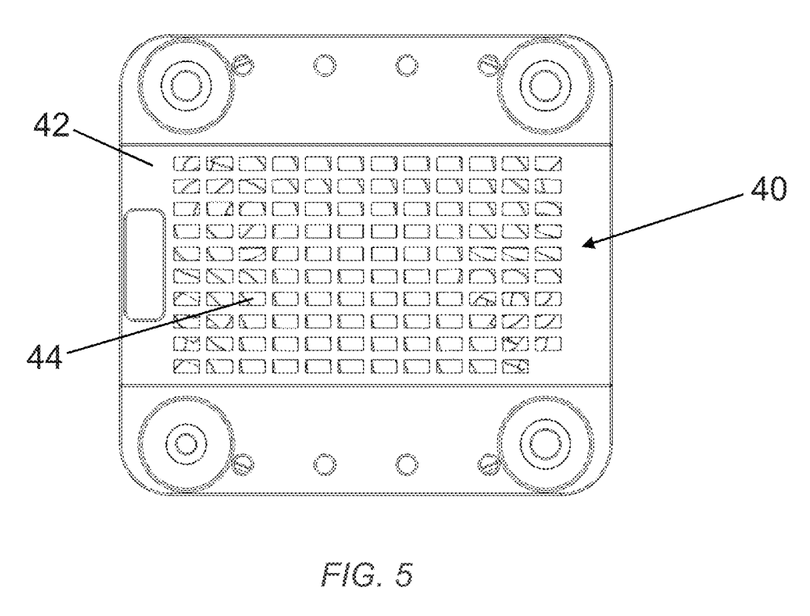
FIG. 5 is a view from below of a second transfer device according to one embodiment of the invention.

FIG. 5 depicts the arrangement of the outlet orifices 44. They are distributed according to a rectangular pattern comprising nine rows of twelve orifices and one row of eleven orifices. Irrespective of the surface under consideration among the inlet surfaces 31, 41 or the outlet surfaces 32, 42, the inlet orifices 33, 43 and the outlet orifices 34, 44 exhibit a shape corresponding to the shape of the watch components 2 according to their predetermined orientation. According to the present embodiment, this shape is substantially rectangular but could, as a variant, adopt any other shape. The number of inlet orifices 33 of the inlet surface 31 of the first transfer device 30 is equal to the number of outlet orifices 34 of the outlet surface 32 of the first transfer device 30, and is similarly equal to the number of inlet orifices 43 of the inlet surface 41 and to the number of outlet orifices 44 of the outlet surface 42 of the second transfer device 40. In the presented embodiment, this number is equal to one hundred and nineteen, although as a variant it could be different. The inlet orifices 33, 43 and/or outlet orifices 34, 44 may be chamfered in order, inter alia, to improve the transfer of the watch components 2 and especially in order to avoid any risk of trapping of the watch components 2.

Figure 6:
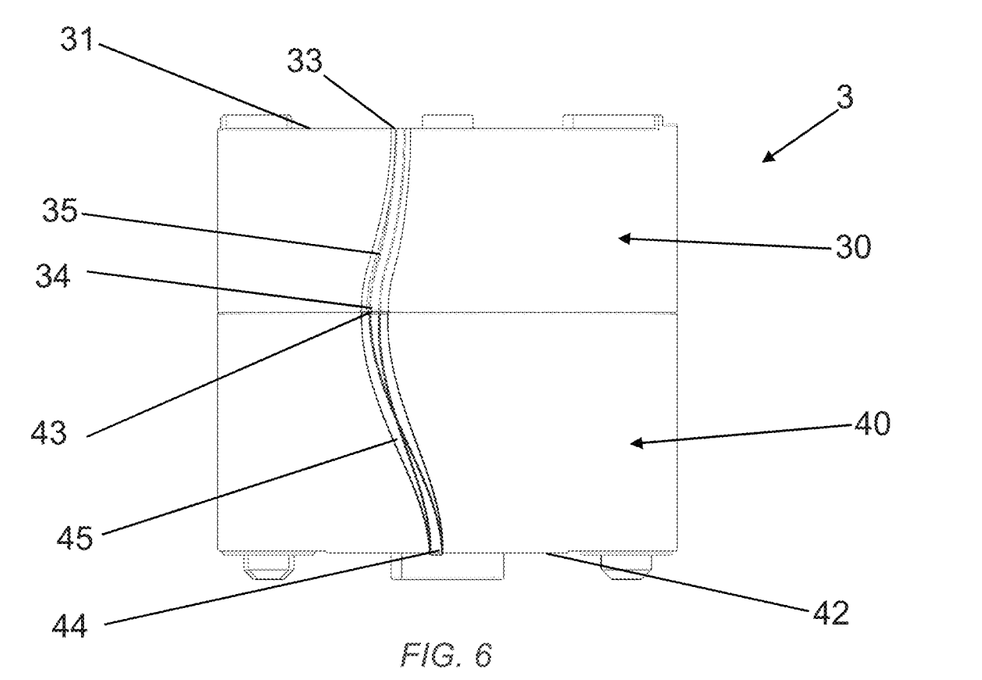
FIG. 6 is a view in cross section of the assembly comprising the two transfer devices according to one embodiment of the invention.

Each of the two transfer devices 30, 40 comprises guide elements 35, 45 allowing to guide the watch components 2 automatically from the inlet orifices to the outlet orifices, that is to say without additional manipulation on the part of an operator. The guide elements 35, 45 are in the form of channels each respectively connecting an inlet orifice positioned on the inlet surface of the transfer device to an outlet orifice positioned on the outlet surface of the transfer device. The guide elements 35, 45 comprise walls allowing to guide a watch component 2 from an inlet orifice to an outlet orifice. The displacement of each watch component 2 in a guide element 35, 45 is managed in such a way as to preserve the integrity of the different surfaces of the watch component 2 during the transfer. Since the outlet orifices 34 of the first transfer device 30 coincide with the inlet orifices 43 of the second transfer device 40, the guide elements 35, 45 are connected in order to form continuous guide elements on the assembly of the two transfer devices. This continuity is depicted in FIG. 6 in particular. Advantageously, not only the outlet orifices 34 coincide with the inlet orifices 43, but the orientation of the guide element 35 similarly coincides with the orientation of the guide element 45 in the area of the plane of separation between the two transfer devices. More specifically, the orientation of each guide element may be perpendicular to the inlet surface or to the outlet surface respectively in the area of the inlet orifices and in the area of the outlet orifices. A watch component 2 may thus slide easily from the guide element 35 to the guide element 45 without the risk of becoming blocked at the interface between the two transfer devices.

The guide elements 35, 45 may comprise all of some of the following characterizing features:
- a curved guide surface; and/or
- a guide surface comprising at least one chicane; and/or
- a guide surface allowing to cause the displacement of a watch component 2 according to a translatory movement and/or according to a rotational movement; and/or
- a guide surface allowing to cause or not to cause a modification to the orientation of a watch component 2; and/or
- a guide surface allowing to cause a modification to the orientation of a watch component 2 in such a way that its contact surface with a support is different on the first and second supports.

The shape and the configuration of the guide elements are thus able to define a transformation of the arrangement of the watch components 2. As may be established from a comparison of FIGS. 4 and 5, between the first arrangement and the second arrangement, the watch components 2 have undergone a displacement, since their relative position has changed from a shape of which the envelope defines a circle to a shape of which the envelope defines a rectangle. Between the first arrangement and the second arrangement, the watch components 2 have similarly undergone a modification to their orientation, since their orientation has changed from an orientation along a circle to an orientation in which all the watch components 2 are parallel to one another. In general terms, each guide element 35, 45 may be defined in order to impose a displacement of a watch component 2 according to one or a plurality of axes, especially in order to impose a rotational movement of the watch component part 2 about one or a plurality of axes. The surface on which a watch component 2 rests in the first support 10 may thus be different from the surface on which the component part rests in the second support 20. A suchlike rotational movement of the watch component 2 may be achieved by means of a chicane arranged in the corresponding guide element.

An assembly 3 may comprise any number of transfer devices, including a single transfer device, for example only the first transfer device 30 or only the second transfer device 40. Advantageously, transfer devices defining different basic transformations of the arrangement of the watch components 2 may be combined in series in one and the same assembly 3 in such a way as to obtain a more complex transformation of the arrangement of the watch components 2. It is thus possible to achieve a great diversity of transformations by combining a limited number of compatible transfer devices. Furthermore, the mounting of a plurality of transfer devices in series makes it possible to limit the length of each guide element and facilitates the recovery of watch components 2 which may have become stuck inadvertently in the transfer device during the transfer.

According to a variant embodiment, a transfer device may be utilized solely in order to modify the orientation of watch components 2 without modifying their relative positions. According to another variant, a transfer device may be utilized to change or invert the positions of different watch components without modifying the pattern determined by their arrangement. Advantageously, the same transfer device may be utilized reversibly, that is to say both for passing from a first arrangement to a second arrangement and for passing from the second arrangement to the first arrangement. In such a case, the transfer device is inverted, and the outlet orifices are utilized as an inlet orifice and the inlet orifices are utilized as an outlet orifice.

According to another variant, a transfer device may be arranged in such a way as to bundle or unbundle watch component parts 2 and to have a number of inlet orifices 33, 43 that is different from the number of outlet orifices 34, 44. For example, a suchlike transfer device may be utilized in order to bundle two watch components 2 in the same zone of the second support 20. Alternatively, when watch components 2 are unbundled, certain zones of the second support 20 may be left empty, for example in order to receive a different watch component. For this purpose, according to the desired transformation, two guide elements of a same transfer device may be connected one to the other by a branch, or else the same guide element may be separated into two distinct branches.

According to another variant, the first support 10 and/or the second support 20 may be a group of supports. For example, in order to separate the component parts to at least two second supports, the pieces of each of these second supports being provided, for example, in order to undergo different surface treatments.

With reference to FIG. 3, the two transfer devices 30, 40 comprise means of indexation 36, 46 permitting single positioning of the two transfer devices one in relation to the other. On the first transfer device, the means of indexation 36 is constituted by four holes 37 of circular shape arranged at the four corners of the outlet surface 32. On the second transfer device, the means of indexation 46 is constituted by four studs 47 of cylindrical shape arranged at the four corners of the inlet surface 41. The four studs 47 are adapted to cooperate with the four holes 37. Advantageously, the means of indexation are provided in such a way that the two transfer devices 30, 40 are able to associate with one another according to a single orientation. Thus, one of the four holes 37 comprises a smaller diameter than the three other holes in such a way as to prevent them from cooperating with only one of the four studs 47 which similarly possess a smaller diameter. In this way, the two transfer devices are prevented from engaging with an inappropriate rotational movement of a quarter of a turn.

Figure 7:
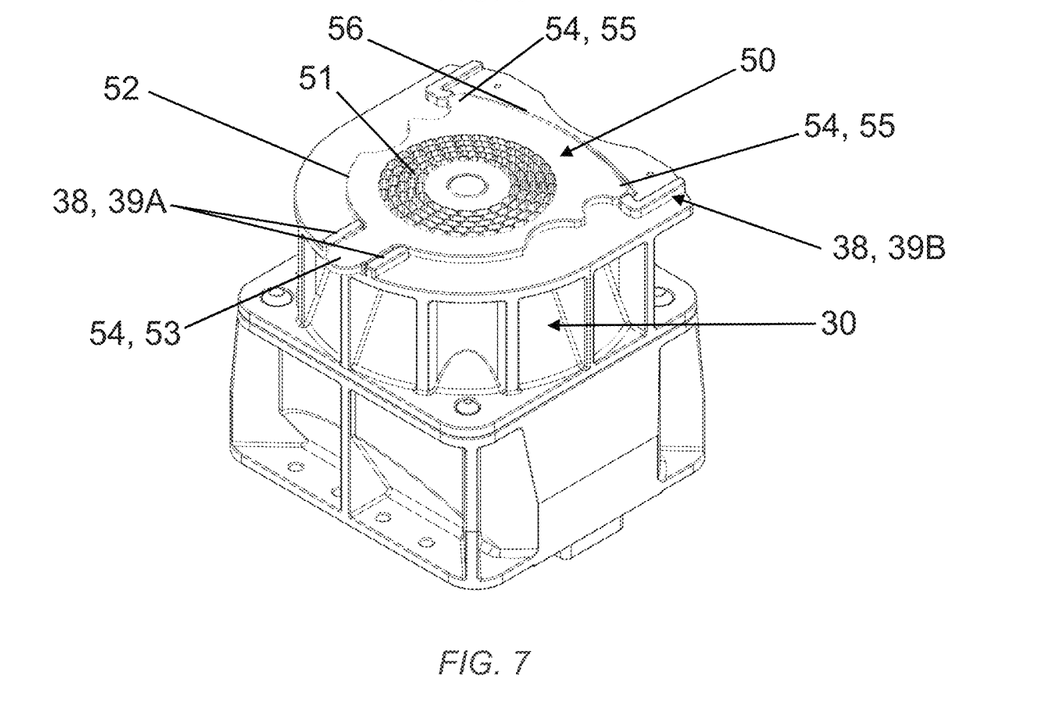
FIG. 7 is an isometric view of the assembly comprising the two transfer devices and of a grille according to one embodiment of the invention.

As illustrated in FIG. 7, the transfer device 30 may comprise a removable grille 50 comprising grille orifices 51 arranged in a manner that is identical to or compatible with the inlet orifices 33 of the inlet surface 31. The grille orifices 51 may be overlaid on inlet orifices 33 of the inlet surface 31 in order to permit the passage of the watch components 2 successively across the grille orifices 51 and the inlet orifices 33. The grille has a generally planar shape. It has a first portion arranged in an arc of a circle 52 extended by a sleeve 53. The grille orifices 51 may possibly be chamfered.

Advantageously, the inlet surface 31 of the first transfer device 30 and/or the grille comprises means of indexation 38, 54 for the correct positioning of the grille 50 relative to the inlet surface 31. On the inlet surface 31, the means of indexation 38 is constituted by vertical projections 39A, 39B defining housings in which the grille 50 may engage. On the grille 50, the means of indexation 54 is constituted, on the one hand, by the sleeve 53 that is capable of being accommodated between two first projections 39A to either side of the sleeve 53. On the other hand, the means of indexation 54 similarly comprises two appendices 55 connected by a second portion arranged in the arc of a circle 56. The two appendices 55 are adapted to abut against two second projections 39B. In this position, the second portion arranged in the arc of a circle 56 is similarly in abutment against a combined means of abutment 39C arranged on the inlet surface 31 of the first transfer device 30. The grille may thus be placed in position in a manner that is unique in relation to the first transfer device by causing it to slide in the plane of the inlet surface 31 in such a way as to ensure that the sleeve 53 passes between the two first projections 39A and until the two first projections 39A come into abutment against the first portion arranged in the arc of a circle 52. In a suchlike position, the grille orifices 51 coincide with the inlet orifices 33 of the first transfer device. One extremity of the sleeve 53 may project beyond the transfer device in such a way that an operator may easily take hold of the grille in order to displace it.

The grille may be made from one and the same material as the inlet surface 31 or from a different material, being both resistant to abrasion and preserving the integrity of the surfaces of the watch components 2. The repeated use of a transfer device equipped with a grille may lead to wear of the surface of the grille. Advantageously, the grille 50 is simple to manufacture and may be replaced easily by a new, identical grille. It is thus not necessary to manufacturer a new transfer device by reason of the wear associated with intensive use.

In an optional manner, the first transfer device may comprise a plate (not illustrated here) arranged in a removable manner between the inlet surface 31 of the first transfer device 30 and the grille 50 in order to permit the temporary retention of the watch components 2 above the inlet surface 31 before their transfer through the inlet orifices 33. Retraction of the plate exposes the inlet orifices, thus permitting the watch components 2 to pass through the transfer device.

As a variant, the plate may comprise openings according to an arrangement that is identical or compatible with the inlet orifices 33 and may be mobile relative to the inlet surface 31, in such a way as to be able to occupy two positions. In a first position, the openings of the plate are not totally overlapped by the inlet orifices 33 in such a way that watch components 2 are able to continue to be retained on the plate. In a second position, the openings of the plate are overlapped by inlet orifices 33 in such a way that watch components 2 are able to be transferred through the openings of the plate and the inlet orifices 33. A displacement of the plate from the first position to the second position causes the displacement of all the watch components 2 directly below the inlet orifices 33, and the latter may then pass through the transfer device.

The first support 10 may be a tray or a container. The second support 20 may be a tray or a container or a vessel, in particular a vessel filled with liquid or with a medium. The first support and the second support are conditionings appropriated to the execution of one stage of a method of manufacturing a watch. Advantageously, the presence of liquid, or of a medium, cushions the fall of the watch components 2 within the second support 20 and/or through guide elements 35, 45. The watch components 2 arrive at the second support 20 gently and do not collide with one another. As an alternative or in addition, the transfer device may be immersed in or filled with a medium.

The first transfer device 30 comprises a generally cylindrical flank and is provided with reinforcing ribs. The second transfer device 40 comprises generally rectangular flanks and is similarly provided with reinforcing ribs. As a result, each transfer device is rigid and solid and as such is adapted for use in a production workshop.

Each transfer device may be monobloc and compact. It may be manufactured from polymer or coated at least partially with a surface made from polymer, or from ceramic, or from metal, especially an alloy of metals, in order to preserve the integrity of the watch components 2, especially in order to avoid deforming them or scratching them or in order to facilitate their transfer. Advantageously it is manufactured from a material that is compatible with manufacturing by addition of material, similarly referred to as additive synthesis, 3D impression or also three-dimensional impression. Additive synthesis makes it possible to produce an actual object by utilizing a specific installation which deposits and/or solidifies the material, layer by layer, in order to obtain a volume. In particular, the transfer device may be manufactured with the aid of one of the following technologies:
 i. modeling by deposition of molten material, similarly referred to as "FDM", like the initials of "Fuse Deposition Modeling"; or
 ii. polymerization or reticulation by layer of a polymer, in particular stereolithography, in particular stereolithography by photopolymerization or SLA; or
 iii. bonding of film with an adhesive, similarly referred to as "LOM", like the initials of "Laminated Object Manufacturing"; or
 iv. agglomeration of a layer of powder by laser sintering, similarly referred to as "SLS", like the initials of "Selective Laser Sintering" or selective laser sintering; or
 v. melting of powder with the aid of a laser, similarly referred to as "SLM", like the initials of "Selective Laser Melting".

These manufacturing techniques permit the design of transfer devices comprising guide elements 35, 45 with complex shapes, especially curved or sinuous shapes. These manufacturing techniques similarly possess a very good reproducibility and permit a highly automated manufacturing process. The manufacturing constraints that are imposed especially by molding or by drilling are thus avoided in this way.

The invention similarly relates to a method of handling watch components 2. The handling method comprises a stage of transport and/or of performing at least one first operation on the watch components 2. This first operation may be a machining operation, for example, especially drilling, tapping, milling, turning, or also undercutting. The first operation may similarly be a washing operation or a finishing operation such as especially a polishing operation, deposition of finishing layers, especially galvanic layers or decorative layers. This first operation may be carried out by means of a machine tool. In the course of this operation, or at the very least at the end of this first operation, the watch components 2 are arranged on the first support 10 according to the first arrangement.

The handling process then comprises a stage of the automatic transfer of the watch components 2 from the first support 10 onto a second support 20 by means of the assembly 3 comprising the two transfer devices 30, 40. The watch components 2 are inserted from the first support into the inlet orifices 33, of which the arrangement corresponds to the arrangement of the watch components 2 in the first support. Then, the watch components 2 slide along the walls of the guide elements 35, 45 as far as the outlet orifices 44. The watch components 2 thus pass through the first arrangement to the second arrangement simply under the effect of gravity, advantageously sensibly simultaneously without the intervention of an operator. It will be appreciated, therefore, that the transfer devices rest preferably on a horizontal or almost completely horizontal plane. Between the first arrangement and the second arrangement, at the interface between the first transfer device 30 and the second transfer device 40, the watch components 2 pass through the third arrangement, which is accordingly a temporary arrangement.

The handling process then comprises a stage of transport and/or of performing at least one second operation on the watch components 2 arranged on the second support 20 and according to the second arrangement. This second operation may be a machining operation, for example, especially drilling, tapping, milling, turning, or even undercutting. The second operation may similarly be a washing operation or a finishing operation, in particular a polishing operation, deposition of finishing layers, in particular galvanic layers or a decorative layer. This second operation may be performed by means of a machine tool and necessitates accurate positioning of the watch components 2 according to the second arrangement.

Thanks to the invention, a transfer device is available for facilitating transformations of the arrangement of watch components 2 and thereby simplifying the method of manufacturing a watch or a clock. The watch components 2 are thus rearranged rapidly, without manipulation and without the risk of damage thereto.

The invention claimed is:

1. A device for the transfer of a plurality of watch components arranged in a first arrangement on a first support to a second arrangement on a second support, wherein the device comprises:
   an inlet surface comprising inlet orifices that are each arranged so as to correspond to respective positions of watch components of the first arrangement of the watch components on the first support,
   an outlet surface comprising outlet orifices that are each arranged so as to correspond to respective positions of watch components of the second arrangement of the watch components on the second support,
   guide elements adapted to guide the watch components automatically from the inlet orifices to the outlet orifices, and
   wherein relative positions between at least some of the watch components in the second arrangement on the second support is different from relative positions between the at least some of the watch components in the first arrangement on the first support.

2. The device for the transfer of watch components as claimed in claim 1, wherein the guide elements are in the form of channels each respectively connecting an inlet orifice positioned on the inlet surface to an outlet orifice positioned on the outlet surface, at least one of the guide elements causing sliding of a watch component on a wall of the at least one of the guide elements from the inlet orifice to the outlet orifice.

3. The device for the transfer of watch components as claimed in claim 1, wherein at least one of the guide elements comprises at least one feature selected from the group consisting of:
   a curved guide surface;
   a guide surface comprising at least one chicane;
   a guide surface adapted to cause the displacement of a watch component according to a translatory movement and/or according to a rotational movement;
   a guide surface adapted to cause or not to cause a modification to the orientation of a watch component;
   a guide surface adapted to cause a modification to the orientation of a watch component so that its contact surface with the first support is different from its contact surface with the second support.

4. The device for the transfer of watch components as claimed in claim 1, wherein the device is made of, or coated at least partially with a surface made of, a material selected from the group consisting of polymer, ceramic, metal, and alloy of metals, in order to avoid clattering the watch components.

5. The device for the transfer of watch components as claimed in claim 2, wherein the device comprises a removable grille comprising grille orifices arranged in a manner that is identical or compatible with the inlet orifices of the inlet surface so as to be capable of being overlaid on the inlet orifices of the inlet surface and to permit the passage of watch components successively through the grille orifices and the inlet orifices.

6. The device for the transfer of watch components as claimed in claim 5, wherein the grille and the inlet surface comprise a means of indexation for the correct positioning of the grille relative to the inlet surface.

7. The device for the transfer of watch components as claimed in claim 5, wherein the device comprises a plate arranged in a removable manner between the inlet surface of the first transfer device and the grille in order to permit the temporary retention of watch components on the inlet surface before the transfer of the watch components through the inlet orifices after retraction or displacement of the plate.

8. The device for the transfer of watch components as claimed in claim 7, wherein the plate comprises openings according to an arrangement that is identical to or compatible with the inlet orifices of the inlet surface, and wherein the plate is mobile relative to the inlet surface, so as to be capable of occupying a first position in which the openings in the plate are not totally overlapped by the inlet orifices of the inlet surface so that watch components are adapted to continue to be retained above the inlet surface, and a second position in which the openings in the plate are overlapped by inlet orifices (33) of the inlet surface so that watch components are adapted to be transferred through the openings in the plate and the inlet orifices of the inlet surface.

9. The device for the transfer of watch components as claimed in claim 1, wherein the device is adapted for the transfer of watch components selected from the group consisting of movement-blanks, wheels of a watch movement, and watch-making components.

10. The device for the transfer of watch components as claimed in claim 1, wherein the device is adapted to be mounted in series with at least one second transfer device.

11. An assembly of at least two devices for the transfer of watch components as claimed in claim 1 arranged in series, wherein the respective guide elements of the at least two transfer devices are connected so to form continuous guide elements on the assembly of the at least two transfer devices.

12. A method of manufacturing a device for the transfer of watch components as claimed in claim 1, wherein the method comprises manufacturing by the addition of material, wherein the manufacturing is performed according to a technology selected from the group consisting of:
   i. modeling by deposition of molten material;
   ii. polymerization or reticulation by layer of a polymer, especially stereolithography;
   iii. bonding of film with an adhesive by laminated object manufacturing (LOM);
   iv. agglomeration of a layer of powder by selective laser sintering (SLS); and
   v. melting of powder with the aid of a laser by selective laser melting (SLM).

13. A system for handling watch components, comprising:
   a first support comprising first housings for the transport and/or the implementation of at least one first operation on the watch components,
   a second, distinct support comprising second housings for the transport and/or the implementation of at least one second operation on the same watch components, and
   a transfer device as claimed in claim 1 for transferring the watch components from the first housings of the first support to the second housings of the second support.

14. The system for handling watch components as claimed in claim 13, wherein the first support is a tray or a container.

15. A method of handling watch components, comprising:
transporting and/or performing at least one first operation on the watch components arranged on a first support, and
automatically transferring the watch components from the first support onto the second support by means of the transfer device as claimed in claim 1, and
transporting and/or performing at least one second operation on the watch components arranged on the second support.

16. The system for handling watch components as claimed in claim 13, wherein the second support is a tray or a container or a vessel.

17. The system for handling watch components as claimed in claim 16, wherein the second support is a vessel filled with liquid or with a medium.

18. The system for handling watch components as claimed in claim 14, wherein the second support is a tray or a container or a vessel.

19. The device for the transfer of watch components as claimed in claim 1, wherein the device is adapted for the transfer of watch components selected from the group consisting of plates, bridges, escape wheels, bracelet links, dial plates and dial indices.

20. The device for the transfer of watch components as claimed in claim 1, wherein the device comprises means of indexation and/or means of retention of a second transfer device in the area of the inlet surface and/or in the area of the outlet surface.

21. The device for the transfer of watch components as claimed in claim 1, wherein the device is configured such that at least some of the watch components are oriented differently in the second arrangement on the second support than in the first arrangement on the first support.

22. The device for the transfer of watch components as claimed in claim 1, wherein the device is configured such that at least some of the watch components are oriented differently around at least a vertical axis in the second arrangement on the second support than in the first arrangement on the first support.

23. The device for the transfer of watch components as claimed in claim 1, wherein the device is configured such that at least some of the watch components are oriented differently with a side of a particular component on which the particular component rests in the second arrangement on the second support being different than a side of that particular component on which that particular component rests in the first arrangement on the first support.

24. The device for the transfer of watch components as claimed in claim 1, wherein the relative positions of the watch components in the second arrangement on the second support includes a plurality of watch components extending in a first direction along a surface of the second support and a plurality of watch components extending in second direction perpendicular to said first direction along the surface of the second support, and the relative positions of the watch components in the first arrangement on the first support includes a plurality of watch components extending in a first direction along a surface of the first support and a plurality of watch components extending in a second direction perpendicular to the first direction along the surface of the first support.

25. The device for the transfer of watch components as claimed in claim 1, wherein said first arrangement on said first support has a first predefined pattern of positions of watch components, and said second arrangement on said second support has a second predefined pattern of positions of watch components.

* * * * *